(12) United States Patent
Ni

(10) Patent No.: US 11,355,566 B2
(45) Date of Patent: Jun. 7, 2022

(54) OLED DISPLAY PANEL AND METHOD FOR MANUFACTURING THE SAME

(71) Applicant: WUHAN CHINA STAR OPTOELECTRONICS SEMICONDUCTOR DISPLAY TECHNOLOGY CO., LTD., Wuhan (CN)

(72) Inventor: Jing Ni, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 388 days.

(21) Appl. No.: 16/622,951

(22) PCT Filed: Jul. 10, 2019

(86) PCT No.: PCT/CN2019/095500
§ 371 (c)(1),
(2) Date: Dec. 16, 2019

(87) PCT Pub. No.: WO2020/155564
PCT Pub. Date: Aug. 6, 2020

(65) Prior Publication Data
US 2021/0335900 A1    Oct. 28, 2021

(30) Foreign Application Priority Data

Jan. 31, 2019 (CN) .......................... 201910098525.6

(51) Int. Cl.
*H01L 27/32* (2006.01)
*H01L 51/00* (2006.01)
*H01L 51/56* (2006.01)

(52) U.S. Cl.
CPC ........ *H01L 27/326* (2013.01); *H01L 27/3234* (2013.01); *H01L 51/003* (2013.01);
(Continued)

(58) Field of Classification Search
CPC ... H01L 27/326; H01L 27/3234; H01L 51/56; H01L 51/003
See application file for complete search history.

(56) References Cited

U.S. PATENT DOCUMENTS

2015/0163382 A1    6/2015 Kwong et al.
2019/0043842 A1*   2/2019 Guo .................. H01L 25/0753
(Continued)

FOREIGN PATENT DOCUMENTS

CN    107946341 A    4/2018
CN    108333810 A    7/2018
(Continued)

*Primary Examiner* — Douglas M Menz
(74) *Attorney, Agent, or Firm* — JMB Davis Ben-David

(57) ABSTRACT

An OLED display panel and the method for manufacturing the same are disclosed in the present invention. The OLED display panel includes an organic film layer, an array layer, an organic light emitting layer, and a package layer disposed on the organic light emitting layer, which are stacked in layers. The organic film layer is provided with a first opening, which is filled with a light-transmitting material to form a light transmission layer. An electronic component area is disposed on one side of the organic film layer away from the package layer and is corresponding to the light transmission layer.

14 Claims, 6 Drawing Sheets

(52) U.S. Cl.
CPC ........ *H01L 51/56* (2013.01); *H01L 2227/323* (2013.01); *H01L 2227/326* (2013.01)

(56) References Cited

U.S. PATENT DOCUMENTS

| | | | |
|---|---|---|---|
| 2019/0326367 A1* | 10/2019 | Jung | G06F 3/0412 |
| 2020/0075680 A1* | 3/2020 | Sun | H01L 51/5256 |
| 2020/0134282 A1* | 4/2020 | Tian | G06V 40/1318 |
| 2020/0203445 A1* | 6/2020 | Ou | H01L 51/5253 |
| 2020/0280021 A1* | 9/2020 | Li | H01L 51/0008 |
| 2020/0321410 A1* | 10/2020 | Wang | H01L 27/3234 |
| 2021/0143364 A1* | 5/2021 | Jin | H01L 27/3276 |
| 2022/0020321 A1* | 1/2022 | Jung | H01L 27/3276 |

FOREIGN PATENT DOCUMENTS

| | | |
|---|---|---|
| CN | 108848213 A | 11/2018 |
| CN | 109040362 A | 12/2018 |
| CN | 208285354 U | 12/2018 |
| CN | 109147595 A | 1/2019 |

\* cited by examiner

OLED DISPLAY PANEL AND METHOD FOR MANUFACTURING THE SAME

CROSS-REFERENCE TO RELATED APPLICATIONS

This is the U.S. National Stage of International Patent Application No. PCT/CN2019/095500 filed Jul. 10, 2019, which in turn claims the benefit of Chinese Patent Application No. 201910098525.6 filed Jan. 31, 2019.

BACKGROUND OF THE INVENTION

1. Field of the Invention

The present application relates to a technical field of display panel, and more particularly to an OLED display panel and a method for manufacturing the same.

2. Description of the Prior Art

Organic light-emitting diodes (OLED) have attracted great attention from academia and industry because of their great potential in the direction of solid-state lighting and flat panel display. OLED panels can be made lighter and thinner, so more and more mobile phone manufacturers choose OLED panels as display screens. A full screen mobile phone is the direction pursued by many manufacturers because it enhances the face value and sense of technology of mobile phone and has a stronger sense of visual experience for users. However, due to the limitation of current technology, the screen proportion of real screens on most mobile phones on the market is uneven. Wherein, an O-cut screen product is a potential design because of its relatively high screen proportion and less influence on visual pictures.

At present, a phone with an O-cut screen needs to leave light paths for an under-screen camera. The camera is located on the back of a substrate of the OLED, the natural light passes through the OLED device to excite a sensor of the camera, which enables the camera to recognize the human figure and display the picture. The natural light will lose a lot of light when it passes through the OLED devices, especially through a reflective anode, a translucent cathode and a PI layer with low penetration rate, the light intake of the under-screen camera is poor.

BRIEF SUMMARY OF THE INVENTION

Technical Problem

The embodiments of the present invention provide an OLED display panel and a method for manufacturing the same to solve the technical problem of the poor light uptake of the under-screen electronic elements due to the poor light transmittance of the existing OLED.

Technical Solutions

One embodiment of the present invention provides an OLED display panel, including an organic film layer, an array layer, an organic light emitting layer, and a package layer disposed on the organic light emitting layer, which are stacked in layers.

The organic film layer is provided with a first opening, which is filled with a light-transmitting material to form a light transmission layer. An electronic component area is disposed on one side of the organic film layer away from the package layer and is corresponding to the light transmission layer.

Further, the array layer and the organic light emitting layer are provided with a second opening, which is corresponding to the light transmission layer;

the package layer is disposed on the organic light emitting layer to fill the second opening for contacting with the light transmission layer.

Further, the package layer includes a first inorganic layer, an organic layer and a second inorganic layer;

the first inorganic layer is disposed on the organic light emitting layer and the light transmission layer on the bottom of the second opening; the organic layer is disposed on the first inorganic layer and fills the second opening; the second inorganic layer is disposed on the organic layer.

In one specific embodiment, a base layer is disposed between the organic film layer and the electronic component area.

In another specific embodiment, a base layer is disposed on one side of the organic film layer away from the packaging layer, and the electronic component area is a third opening formed in the base layer.

Further, the light transmission layer is cylindrical or a polyhedron with an isosceles trapezoidal cross section, and the light-transmitting material is transparent glass.

Further, the organic film layer is made of polyimide or polyethylene terephthalate.

One embodiment of the present invention further provides a method for manufacturing an OLED display panel, wherein, including:

providing a substrate;

forming a light transmission layer on the substrate and forming an organic film layer on the substrate around the light transmission layer;

forming an array layer, an organic light emitting layer and a package layer on the organic film layer in turn; and removing the substrate; and disposing an electronic component area, which is on one side of the organic film layer away from the package layer and is corresponding to the light transmission layer.

Further, the step of forming a light transmission layer on the substrate and forming an organic film layer on the substrate around the light transmission layer specifically includes:

forming a first sacrificial layer, the light transmission layer, a second sacrificial layer and a barrier layer on the substrate in turn; and forming the organic film layer on the substrate around the light transmission layer; wherein the thickness of the organic film layer is not greater than the sum of the thickness of the first sacrificial layer and the light transmission layer.

Further, an adhesion between the barrier layer and the second sacrificial layer is greater than that between the second sacrificial layer and the light transmission layer, and an adhesion between the second sacrificial layer and the light transmission layer is greater than that between the first sacrificial layer and the substrate.

Further, the light transmission layer is cylindrical or a polyhedron with an isosceles trapezoidal cross section; and the barrier layer is a polyhedron with an inver Further, the light transmission layer is made of transparent glass; the barrier layer is made of transparent glass; and the first sacrificial layer and the second sacrificial layer are made of transparent conductive oxides.

Further, the step of forming an array layer, an organic light emitting layer and a package layer on the organic film layer in turn specifically includes:

forming the array layer and the organic light emitting layer on the organic film layer in turn;

removing the second sacrificial layer by mechanical stripping to form a second opening on the array layer and the organic light emitting layer; and forming the package layer on the organic light emitting layer, and filling the second opening with the package layer to make the package layer contact with the light transmission layer.

Further, after the step of removing the substrate, the method further includes:

forming a base layer disposed on one side of the organic film layer away from the packaging layer and forming a third opening on the base layer, wherein the third opening is used as the electronic component area.

Beneficial Effect

The beneficial effects of this application are as follows: the organic film layer is provided with the first opening, which is filled with the light-transmitting material to form the light transmission layer. The electronic component area is disposed on the bottom of the panel and is corresponding to the light transmission layer, thereby avoiding a lot of light loss, effectively enhancing the penetration of the OLED display panel, and increasing the light uptake of the sensor under the screen. In the process of making the OLED display panel, a laser cutting is avoided, and the damage caused by the laser cutting is reduced.

BRIEF DESCRIPTION OF THE DRAWINGS

For more clearly illustrating the technical scheme in the embodiment of the present application or the prior art, the following text will briefly introduce the accompanying drawings used in the embodiment or the prior art. It is obvious that the accompanying drawings in the following description are only some embodiments of the present application. For the ordinary technical personnel of the field, other drawings can also be obtained from these drawings without paying creative work.

DETAILED DESCRIPTION OF THE PREFERRED EMBODIMENTS

Figure 1:
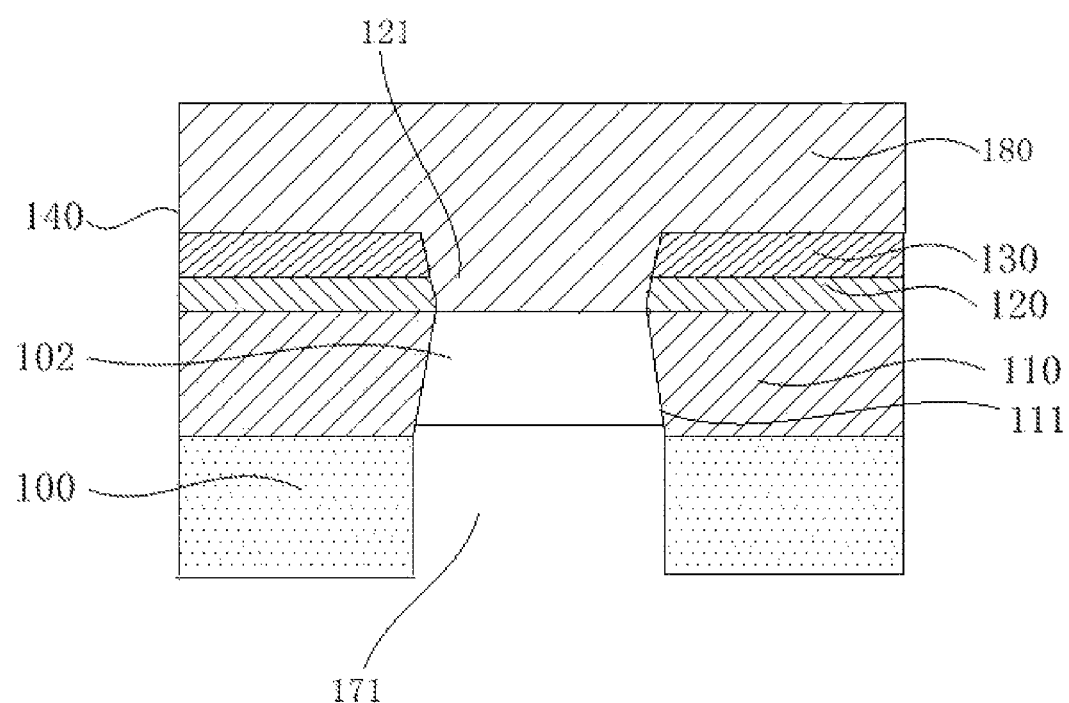
FIG. 1 is a structure schematic view of an OLED display panel provided by one embodiment of the present invention.

The following preferred embodiments of the present invention are described with reference to the accompanying drawings to illustrate, and are used to illustrate that the invention can be implemented by examples. These embodiments can fully introduce the technical contents of the present invention to technicians in the field so as to make the technical contents of the present invention clearer and easier to understand. However, the present invention can be embodied by many different forms of embodiments, and the protection scope of the present invention is not limited to the embodiments mentioned herein.

The terms used in the specification of the present invention are used only to describe specific embodiments and are not intended to show the concepts of the present invention. Unless the context has a distinct meaning, expressions in singular form cover expressions in plural form. In the specification of the present invention, it should be understood that terms such as "including", "having" and "containing" are intended to illustrate the possibility of the existence of features, numbers, steps, actions or combinations disclosed in the specification of the present invention, and are not intended to exclude the possibility of adding one or more other features, numbers, steps, actions or combinations. The same reference labels in the drawings refer to the same parts.

Referring to FIG. 1, FIG. 1 is a structure schematic view of an OLED display panel provided by one embodiment of the present invention.

The OLED display panel provided by the embodiment of the present invention includes an organic film layer 110, an array layer 120, an organic light emitting layer 130, and a package layer 180 disposed on the organic light emitting layer 130, which are stacked in layers. Wherein, the organic film layer 110 can be prepared by the methods of coating, suspension coating, etc. The organic film layer 110 can be made of a polymer material including, but being not limited to polyimide (PI), polyethylene terephthalate (PET), etc. The array layer 120 includes a TFT film layer and other film layers, which can be prepared by CVD (Chemical Vapor Deposition), coating, exposure, etching, etc. The organic light emitting layer 130 includes an electron injection layer, an electron transport layer, a light-emitting layer, a hole transport layer, a hole injection layer and other composite films, which can be prepared by evaporation equipment. The package layer 180 includes multiple of organic layers and inorganic layers for isolating water and oxygen.

The organic film layer 110 is provided with a first opening 111, and the first opening 111 is filled with a light-transmitting material. The filled light-transmitting material forms a light transmission layer 102. The OLED display panel further includes an electronic component area 171, which is located on one side of the organic film layer 110 away from the package layer 180 and is corresponding to the light transmission layer 102. Wherein, the light transmission layer 102 is made of transparent glass, and can be prepared by using glass powder and 3D printing. The light transmission layer 102 can be cylindrical or a polyhedron with an isosceles trapezoidal cross section. The electronic component area 171 is used to accommodate sensors. In the embodiment, the electronic component area 171 is corresponding to the light transmission layer, which can effectively enhance the penetration of the OLED display panel and increase the light uptake of electronic components (such as a camera) under the screen.

Further, referring to FIG. 1, the array layer 120 and the organic light emitting layer 130 are provided with a second opening 121, which is corresponding to the light transmission layer 102. Wherein, the second opening 121 passes through the array layer 120 and the organic light emitting layer 130 and is corresponding to the light transmission layer 102. Namely, the second opening 121 is corresponding to the electronic component area 171.

The package layer 180 is disposed on the organic light emitting layer 130 to fill the second opening 121 for contacting with the light transmission layer 102. Namely, the second opening 120 is filled with the material of the package layer 180, so that the position of the electronic component area 171 only corresponds to the light transmission layer 102 and the package layer 180, and other positions correspond to the film layers with poor light transmittance, thereby further enhancing the penetration of the OLED display panel and increasing the light uptake of the under-screen electronic components.

Figure 2:
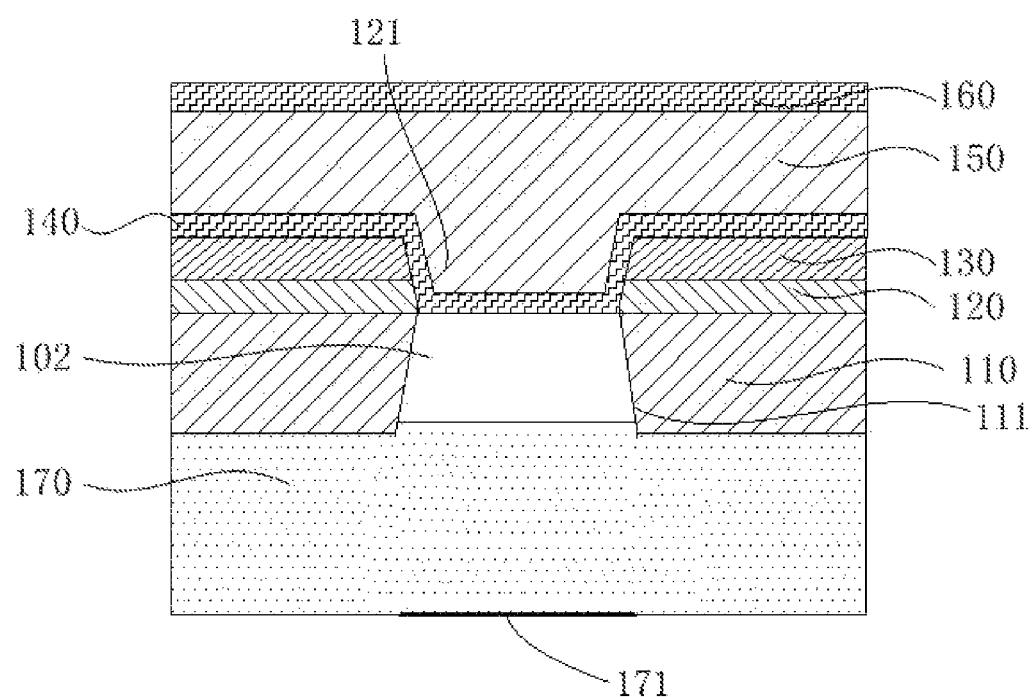
FIG. 2 is another structure schematic view of an OLED display panel provided by one embodiment of the present invention.

Further, referring to FIG. 2, the package layer 180 includes a first inorganic layer 140, an organic layer 150 and a second inorganic layer 160. Wherein, the first inorganic layer 140 is obtained by PECVD (plasma enhanced chemical vapor Deposition), PLD (Pulsed Laser Deposition), or Sputter, and the thickness of the first inorganic layer 140 is between 0.01 and 1 um. The first inorganic layer 140 is made of an inorganic functional material, including, but being not limited to, such as Al2O3, TiO2, SiNx, SiCNx, SiOx, ZrO2, etc for increasing water and oxygen resistance. The organic layer 150 can be obtained by inkjet printing (IJP). The organic layer 150 is made of an organic transparent material, including, but being not limited to such as hexamethyldimethylsilyl ether (HMDSO), acrylate (Acrylate), polyacrylate, polycarbonate, polystyrene, etc. The second inorganic layer 160 is obtained by PECVD, PLD or Sputter, and the thickness of the second inorganic layer 160 is between 0.01 and 1 um. The second inorganic layer 160 is made of an inorganic functional material, including, but being not limited to, such as Al2O3, TiO2, SiNx, SiCNx, SiOx, ZrO2, etc for increasing water and oxygen resistance.

The first inorganic layer 140 is disposed on the organic light emitting layer 130 and the light transmission layer 102 on the bottom of the second opening 121. The organic layer 150 is disposed on the first inorganic layer 140 and can fill the second opening 121. The second inorganic layer 160 is disposed on the organic layer 150.

In one specific embodiment, referring to FIG. 1, there is a base layer 170 disposed on one side of the organic film layer 110 away from the packaging layer 180. The electronic component area 171 is a third opening formed in the base layer 170, and the third opening is corresponding to the light transmission layer 102. Wherein, the base layer 170 is a composite layer including a bottom module.

In another specific embodiment, referring to FIG. 2, there is a base layer 170 between the organic film layer 110 and the electronic component area 171. The electronic component area 171 is located on one side of the base layer 170 away from the organic film layer 110.

As described above, the embodiment provides the OLED display panel. The organic film layer is provided with the first opening, which is filled with the light-transmitting material to form the light transmission layer. The electronic component area is disposed on the bottom of the panel and is corresponding to the light transmission layer, thereby avoiding a lot of light loss, effectively enhancing the penetration of the OLED display panel, and increasing the light uptake of the sensor under the screen.

Figure 3:
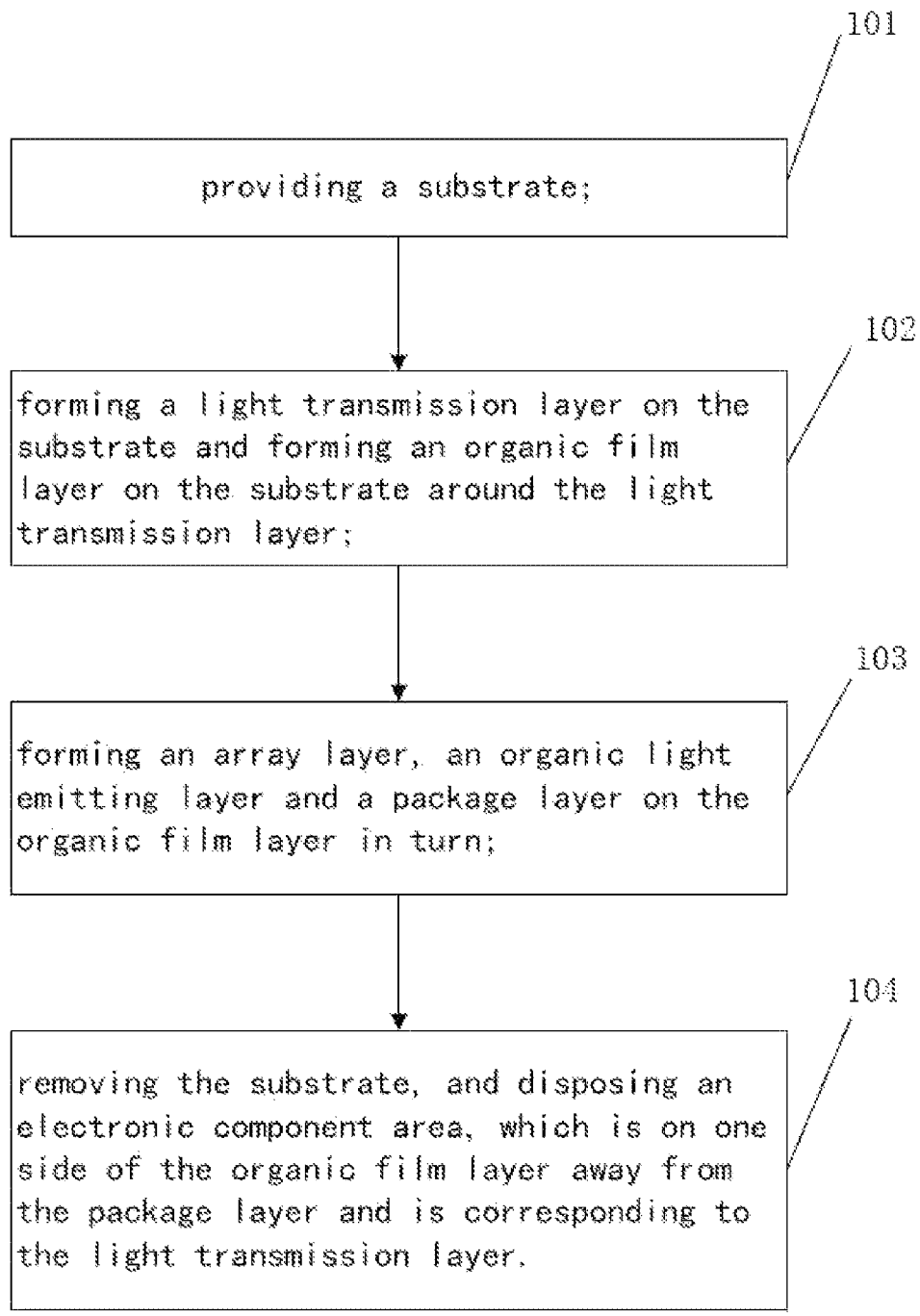
FIG. 3 is a flow chart of the method for manufacturing the OLED display panel provided by one embodiment of the present invention.

Referring to FIG. 3, FIG. 3 is a flow chart of the method for manufacturing the OLED display panel provided by one embodiment of the present invention.

The method for manufacturing an OLED display panel provided in the embodiment of the present invention includes the following steps.

A step 101 is to provide a substrate.

In the embodiment, the substrate is glass.

A step 102 is to form a light transmission layer on the substrate and form an organic film layer on the substrate around the light transmission layer.

In the embodiment, the light transmission layer is formed on the substrate first, and then the organic film layer is formed on the substrate, so that the light transmission layer and the organic film layer are located on one side of the substrate together, and the organic film layer is located around the light transmission layer.

Specifically, the step 102 includes:

forming a first sacrificial layer, the light transmission layer, a second sacrificial layer and a barrier layer on the substrate in turn; and forming the organic film layer on the substrate around the light transmission layer; wherein the thickness of the organic film layer is not greater than the sum of the thickness of the first sacrificial layer and the light transmission layer.

Figure 4:
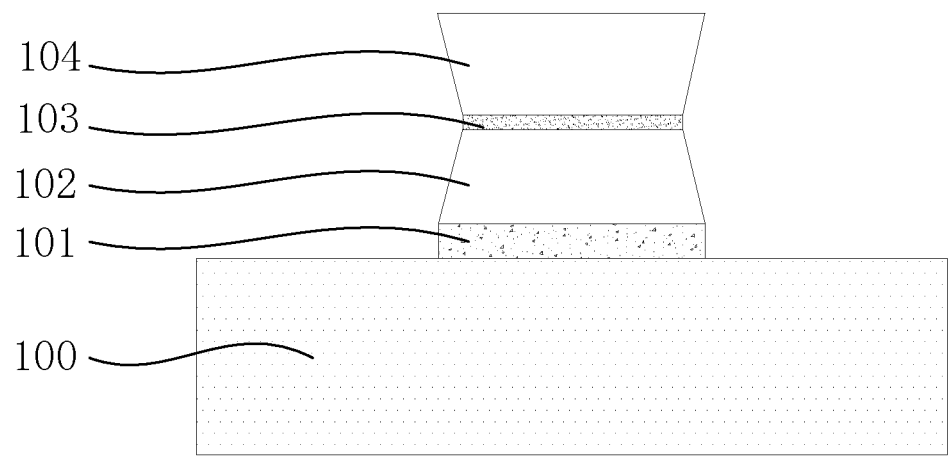
FIG. 4 is one schematic view for performing a step 102 in the method for manufacturing the OLED display panel provided by one embodiment of the present invention.

Referring to FIG. 4, the first sacrificial layer 101, the light transmission layer 102, the second sacrificial layer 103 and the barrier layer 104 are formed on the substrate 100 in turn. Wherein, the first sacrificial layer 101 is located on the substrate 100, the light transmission layer 102 is located on one side of the first sacrificial layer 101 away from the substrate 100, the second sacrificial layer 103 is located on one side of the light transmission layer 102 away from the first sacrificial layer 101, and the barrier layer 104 is located on one side of the second sacrificial layer 103 away from the light transmission layer 102.

Wherein, the light transmission layer 102 and the barrier layer 104 are made of transparent glass and are prepared by using glass powder and 3D printing. The thicknesses of the light transmission layer 102 and the barrier layer 104 are between 10 and 20 um. The light transmission layer 102 can be cylindrical or a polyhedron with an isosceles trapezoidal cross section. The barrier layer 104 can be a polyhedron with an inverted trapezoidal longitudinal section, and an angle between a long bottom and an inclined side of the inverted trapezoidal is less than 60 degrees. The film layers of the subsequent process can be separated by the barrier layer 104.

The first sacrificial layer 101 and the second sacrificial layer 103 are made of transparent conductive oxides, such as AZO, ITO or IZO, etc, and can be prepared by PVD or sputtering. It should be pointed out that the transparent conductive oxides are characterized by adjustable surface roughness, so the first and second sacrificial layers 101, 103 with different roughness can be obtained by depositing the first sacrificial layer 101 and the second sacrificial layer 103 with different thickness, thus adjusting the adhesion between the first sacrificial layer 101 and the substrate 100 and the adhesion between the second sacrificial layer 103 and the light transmission layer 102. In the embodiment, the adhesion between the barrier layer 104 and the second sacrificial layer 103 is greater than that between the second sacrificial layer 103 and the light transmission layer 102, and the adhesion between the second sacrificial layer 103 and the light transmission layer 102 is greater than that between the first sacrificial layer 101 and the substrate 100.

Figure 5:
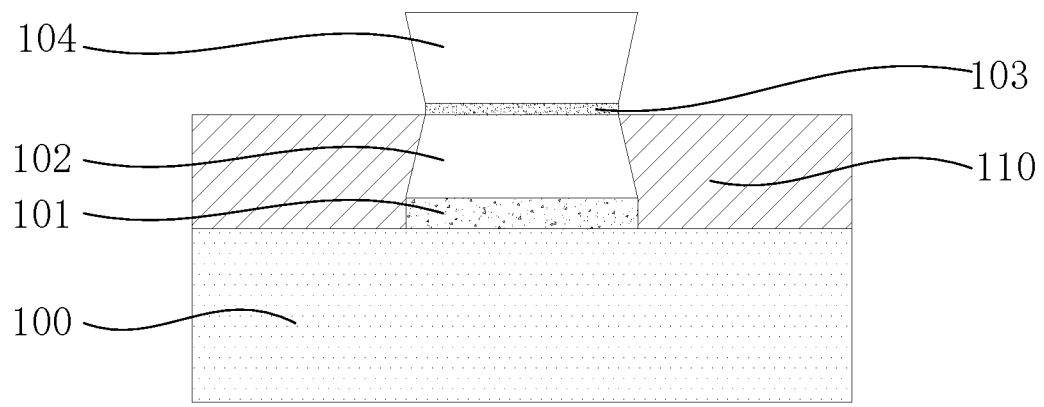
FIG. 5 is another schematic view for performing the step 102 in the method for manufacturing the OLED display panel provided by one embodiment of the present invention.

Furthermore, as shown in FIG. 5, the organic film layer 110 is formed on the substrate 100 around the light transmission layer 102. The organic film layer 110 can be prepared by coating, suspension coating, etc. The organic film layer 110 is made of a polymer material including, but being not limited to polyimide (PI), polyethylene terephthalate (PET), etc. The thickness of the organic film layer 110 is not greater than the sum of the thicknesses of the first sacrificial layer 101 and the light transmission layer 102. Namely, an upper surface of the organic film layer 110 is even with or slightly lower (no more than 0.5 um) than that of the light transmission layer 102.

A step 103 is to form an array layer, an organic light emitting layer and a package layer on the organic film layer in turn.

In the embodiment, the array layer is located on one side of the organic film layer away from the substrate, the organic light emitting layer is located on one side of the array layer away from the substrate, and the package layer is located on one side of the organic light emitting layer away from the substrate.

Specifically, the step 103 includes:

forming the array layer and the organic light emitting layer on the organic film layer in turn;

removing the second sacrificial layer by mechanical stripping to form a second opening on the array layer and the organic light emitting layer; and forming the package layer on the organic light emitting layer, and filling the second opening with the package layer to make the package layer contact with the light transmission layer.

Figure 6:
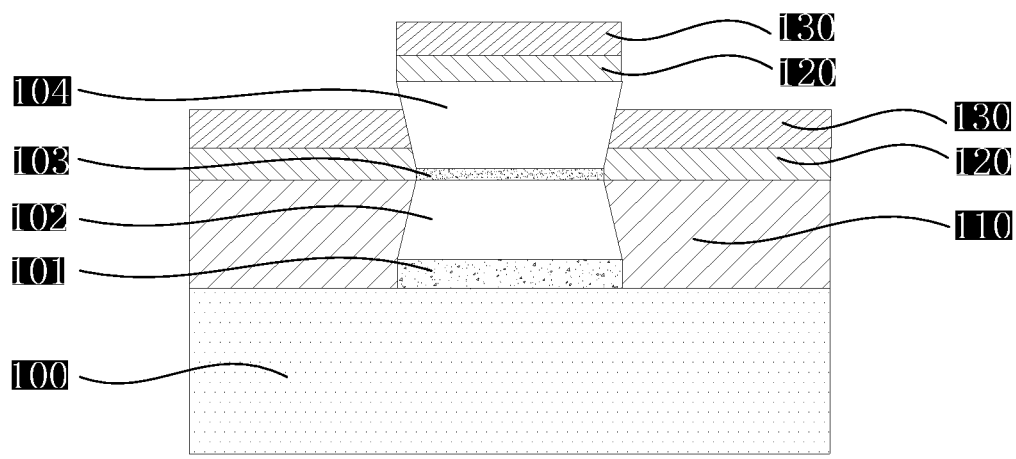
FIG. 6 is one schematic view for performing a step 103 in the method for manufacturing the OLED display panel provided by one embodiment of the present invention.

Referring to FIG. 6, the array layer 120 is formed on the organic film layer 110 in turn, and then the organic light emitting layer 130 is formed on the array layer 120. Wherein, the array layer 120 includes a TFT film layer and other film layers, which can be prepared by CVD (Chemical Vapor Deposition), coating, exposure, etching, etc. The organic light emitting layer 130 includes an electron injection layer, an electron transport layer, a light-emitting layer, a hole transport layer, a hole injection layer and other composite films, which can be prepared by evaporation equipment. Moreover, the organic light emitting layer 130 may include an inorganic packaging layer after evaporation. An upper surface of the organic light emitting layer 130 corresponding to the organic film layer 110 is lower than an upper surface of the barrier layer 104, so that the array layer 120 and the organic light emitting layer 130 corresponding to the organic film layer 110 are separated from the array layer 120 and the organic light emitting layer 130 corresponding to the barrier layer 104, respectively.

Figure 7:
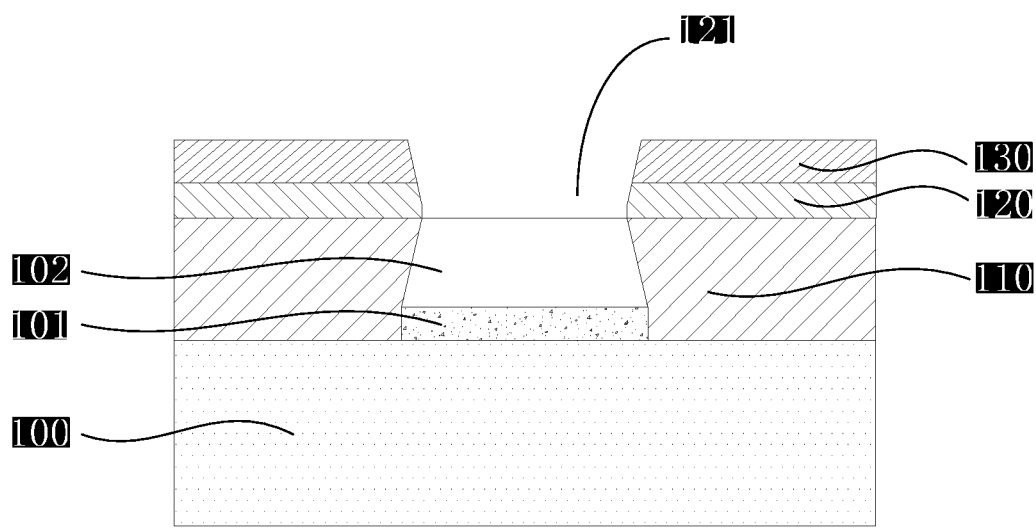
FIG. 7 is another schematic view for performing the step 103 in the method for manufacturing the OLED display panel provided by one embodiment of the present invention.

Furthermore, the second sacrificial layer 103, the barrier layer 104, and the array layer 120 and the organic light emitting layer 130, which are corresponding to the barrier layer 104, are peeled off by mechanical peeling, so that the light transmission layer 102 is exposed. After peeling, as shown in FIG. 7, the array layer 120 and the organic light emitting layer 130, which are corresponding to the organic film layer 110, form the second opening 121 therein.

Figure 8:
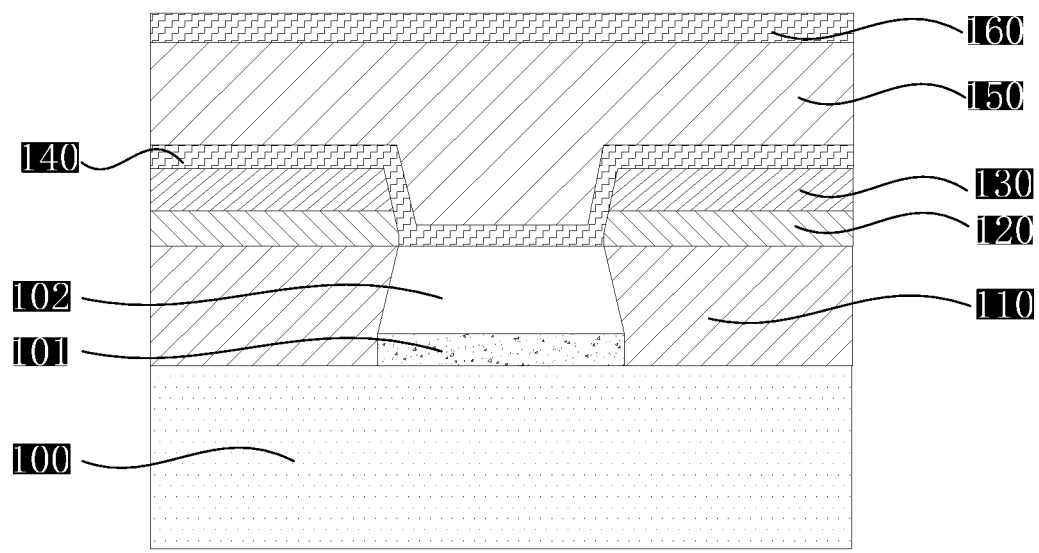
FIG. 8 is another one schematic view for performing the step 103 in the method for manufacturing the OLED display panel provided by one embodiment of the present invention.

Referring to FIG. 8, the package layer 180 includes a first inorganic layer 140, an organic layer 150 and a second inorganic layer 160. The first inorganic layer 140 is formed on the retained organic light emitting layer 130 and on the light transmission layer 102 located on the bottom of the second opening 121. The organic layer 150 is formed on the first inorganic layer 140, and can fill the second opening 121. The second inorganic layer 160 is formed on the organic layer 150.

Wherein, the first inorganic layer 140 is obtained by PECVD, PLD or Sputter, and the thickness of the first inorganic layer 140 is between 0.01 and 1 um. The first inorganic layer 140 is made of an inorganic functional material, including, but being not limited to, such as Al2O3, TiO2, SiNx, SiCNx, SiOx, ZrO2, etc for increasing water and oxygen resistance. The organic layer 150 can be obtained by inkjet printing (IJP). The organic layer 150 is made of an organic transparent material, including, but being not limited to such as HMDSO, Acrylate, polyacrylate, polycarbonate, polystyrene, etc. The second inorganic layer 160 is obtained by PECVD, PLD or Sputter, and the thickness of the second inorganic layer 160 is between 0.01 and 1 urn. The second inorganic layer 160 is made of an inorganic functional material, including, but being not limited to, such as Al2O3, TiO2, SiNx, SiCNx, SiOx, ZrO2, etc for increasing water and oxygen resistance.

A step 104 is to remove the substrate, and dispose an electronic component area, which is on one side of the organic film layer away from the package layer and is corresponding to the light transmission layer.

Specifically, the step 104 includes:

removing the substrate and the first sacrificial layer by mechanical stripping to make the light transmission layer and the organic film layer uncovered.

Figure 9:
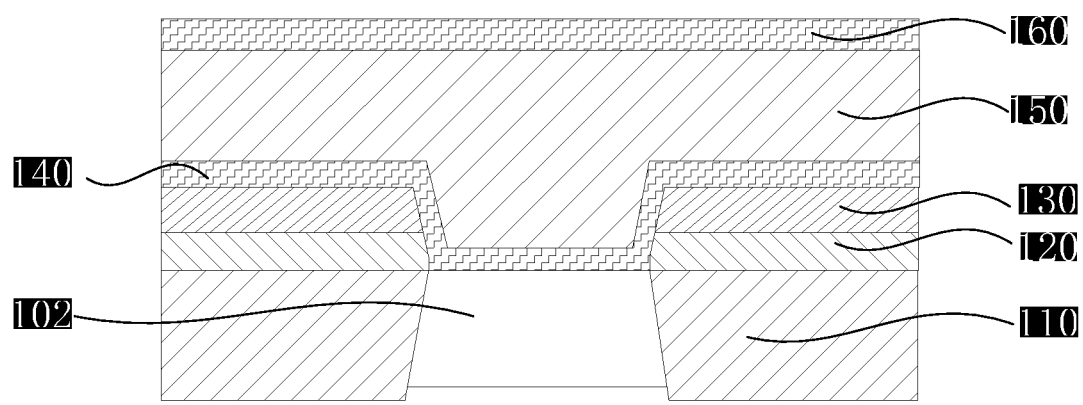
FIG. 9 is one schematic view for performing a step 104 in the method for manufacturing the OLED display panel provided by one embodiment of the present invention.

Referring to FIG. 9, the substrate 100 and the first sacrificial layer 101 are removed by mechanical stripping to make the light transmission layer 102 and the organic film layer 110 be exposed. Moreover, the electronic component area (not shown in FIG. 9) is disposed on one side of the organic film layer 110 away from the package layer and is corresponding to the light transmission layer, thereby effectively enhancing the penetration of the OLED display panel and increasing the light intake of the sensor under the screen.

Further, after removing the substrate, the method also includes:

forming a base layer disposed on one side of the organic film layer away from the packaging layer and forming a third opening on the base layer, wherein the third opening can be used as the electronic component area.

Referring to FIGS. 1 and 2, the base layer 170 are formed on one side of the light transmission layer 102 and the organic film layer 110 away from the packaging layer. The base layer 170 is a composite layer including a bottom module. Referring to FIG. 1, the electronic component area 171 may be the third opening formed in the base layer 170. Referring to FIG. 2, the electronic component area 171 is located on one side of the base layer 170 away from the organic film layer 110. The film layer with lower penetration rate above the electronic component area has been removed, which greatly reduces the loss rate of light passing through the film layer to the sensor when the sensor (e.g. a camera sensor) is placed in the electronic component area 171.

As can be seen from the above, the embodiment provides the method for manufacturing the OLED display panel. The organic film layer is provided with the first opening, which is filled with the light-transmitting material to form the light transmission layer. The electronic component area is disposed on the bottom of the panel and is corresponding to the light transmission layer, thereby avoiding a lot of light loss, effectively enhancing the penetration of the OLED display panel, and increasing the light uptake of the sensor under the screen. In the process of making the OLED display panel, a laser cutting is avoided, and the damage caused by the laser cutting is reduced.

As described above, although the application has been disclosed in the preferred embodiments as above, the preferred embodiments mentioned above are not intended to limit the application. The ordinary technical personnel in the field may make various changes and embellishments without departing from the spirit and scope of the application. Therefore, the scope of protection of the application is subject to the scope defined by the claims.

What is claimed is:

1. An OLED display panel, wherein, including an organic film layer, an array layer, an organic light emitting layer, and a package layer disposed on the organic light emitting layer, which are stacked in layers;
    the organic film layer being provided with a first opening, which is filled with a light-transmitting material to form a light transmission layer; an electronic component area being disposed on one side of the organic film layer away from the package layer and being corresponding to the light transmission layer.

2. The OLED display panel as claimed in claim 1, wherein the array layer and the organic light emitting layer are provided with a second opening, which is corresponding to the light transmission layer;
    the package layer is disposed on the organic light emitting layer to fill the second opening for contacting with the light transmission layer.

3. The OLED display panel as claimed in claim 2, wherein the package layer includes a first inorganic layer, an organic layer and a second inorganic layer;
    the first inorganic layer is disposed on the organic light emitting layer and the light transmission layer on the bottom of the second opening; the organic layer is disposed on the first inorganic layer and fills the second opening; the second inorganic layer is disposed on the organic layer.

4. The OLED display panel as claimed in claim 2, wherein a base layer is disposed between the organic film layer and the electronic component area.

5. The OLED display panel as claimed in claim 1, wherein a base layer is disposed on one side of the organic film layer away from the packaging layer, and the electronic component area is a third opening formed in the base layer.

6. The OLED display panel as claimed in claim 1, wherein the light transmission layer is cylindrical or a polyhedron with an isosceles trapezoidal cross section, and the light-transmitting material is transparent glass.

7. The OLED display panel as claimed in claim 1, wherein the organic film layer is made of polyimide or polyethylene terephthalate.

8. A method for manufacturing an OLED display panel, wherein, including:
    providing a substrate;
    forming a light transmission layer on the substrate and forming an organic film layer on the substrate around the light transmission layer;
    forming an array layer, an organic light emitting layer and a package layer on the organic film layer in turn; and
    removing the substrate; and disposing an electronic component area, which is on one side of the organic film layer away from the package layer and is corresponding to the light transmission layer.

9. The method for manufacturing the OLED display panel as claimed in claim 8, wherein the step of forming a light transmission layer on the substrate and forming an organic film layer on the substrate around the light transmission layer specifically includes:
    forming a first sacrificial layer, the light transmission layer, a second sacrificial layer and a barrier layer on the substrate in turn; and
    forming the organic film layer on the substrate around the light transmission layer; wherein the thickness of the organic film layer is not greater than the sum of the thickness of the first sacrificial layer and the light transmission layer.

10. The method for manufacturing the OLED display panel as claimed in claim 9, wherein an adhesion between the barrier layer and the second sacrificial layer is greater than that between the second sacrificial layer and the light transmission layer, and an adhesion between the second sacrificial layer and the light transmission layer is greater than that between the first sacrificial layer and the substrate.

11. The method for manufacturing the OLED display panel as claimed in claim 9, wherein the light transmission layer is cylindrical or a polyhedron with an isosceles trapezoidal cross section; and the barrier layer is a polyhedron with an inverted trapezoidal longitudinal section.

12. The method for manufacturing the OLED display panel as claimed in claim 9, wherein the light transmission layer is made of transparent glass; the barrier layer is made of transparent glass; and the first sacrificial layer and the second sacrificial layer are made of transparent conductive oxides.

13. The method for manufacturing the OLED display panel as claimed in claim 9, wherein the step of forming an array layer, an organic light emitting layer and a package layer on the organic film layer in turn specifically includes:
    forming the array layer and the organic light emitting layer on the organic film layer in turn;
    removing the second sacrificial layer by mechanical stripping to form a second opening on the array layer and the organic light emitting layer; and
    forming the package layer on the organic light emitting layer, and filling the second opening with the package layer to make the package layer contact with the light transmission layer.

14. The method for manufacturing the OLED display panel as claimed in claim 8, wherein after the step of removing the substrate, the method further includes:
    forming a base layer disposed on one side of the organic film layer away from the packaging layer and forming a third opening on the base layer, wherein the third opening is used as the electronic component area.

* * * * *